United States Patent [19]
Okada et al.

[11] Patent Number: 5,690,846
[45] Date of Patent: Nov. 25, 1997

[54] LASER PROCESSING METHOD

[75] Inventors: Toshiharu Okada, Ibaraki; Izuru Nakai; Yuji Uesugi, both of Osaka, all of Japan

[73] Assignee: Matsushita Electric Industrial Co., Ltd., Osaka-fu, Japan

[21] Appl. No.: 576,638

[22] Filed: Dec. 21, 1995

[30] Foreign Application Priority Data

Dec. 22, 1994 [JP] Japan .................. 6-320238

[51] Int. Cl.$^6$ .................. B23K 26/08
[52] U.S. Cl. .................. 219/121.78; 219/121.71; 219/121.82; 219/121.83; 219/121.85
[58] Field of Search .................. 219/121.7, 121.71, 219/121.68, 121.69, 121.78, 121.79, 121.8, 121.81, 121.82, 121.83, 121.85; 364/474.08; 356/123, 399

[56] References Cited

U.S. PATENT DOCUMENTS

| | | | |
|---|---|---|---|
| 3,549,733 | 12/1970 | Caddell | 219/121.69 |
| 4,154,530 | 5/1979 | Connolly, Jr. et al. | 219/121.68 |
| 4,532,402 | 7/1985 | Overbeck | 219/121.78 |
| 4,685,775 | 8/1987 | Goodman | 359/225 |
| 4,769,523 | 9/1988 | Tanimoto et al. | 219/121.82 |
| 4,918,284 | 4/1990 | Weisz | 219/121.78 |
| 4,941,082 | 7/1990 | Pailthorp et al. | 219/121.78 |
| 5,329,090 | 7/1994 | Woelki et al. | 219/121.68 |

FOREIGN PATENT DOCUMENTS

| | | | |
|---|---|---|---|
| 62-45493 | 2/1987 | Japan . | |
| 2-192885 | 7/1990 | Japan | 219/121.68 |
| 5-104264 | 4/1993 | Japan . | |

Primary Examiner—Teresa J. Walberg
Assistant Examiner—Gregory L. Mills
Attorney, Agent, or Firm—Wenderoth, Lind & Ponack

[57] ABSTRACT

A laser processing method is to be executed by a pair of turning mirrors of which axes of rotation are arranged in mutually twisted positions, a flat field lens for converging a laser beam reflected on the pair of turning mirrors on a specified plane, and an X-Y stage which carries and moves thereon an object to be processed to which the laser beam is applied, the object having a plurality of rectangular planar areas of the same shape as each other in a matrix form and adjoining the rectangular planar areas while not overlapping the rectangular planer area nor leaving any space therebetween. The method includes a first step of executing application of the laser beam of which a laser applying position is determined by the pair of turning mirrors and the flat field lens to one of the rectangular planar areas of the object, a second step of moving an X-axis stage or a Y-axis stage of the X-Y stage after the first step is completed, a third step of executing application of the laser beam to one of the rectangular planar areas which is adjacent to the rectangular planar area to which the latest application of the laser beam is performed, and a fourth step of executing the second and third steps alternately to process the plurality of rectangular planar areas of the object.

2 Claims, 9 Drawing Sheets

PINCUSHION DISTORTION

LINEARITY DISTORTION

SYNTHETIC DISTORTION

ROTATIONAL DEVIATION BETWEEN COORDINATE SYSTEMS OF GALVANOMETER AND X-Y STAGE

OVERLAP OF 50-mm SQUARE AREAS BEFORE AND AFTER ROTATION CORRECTION

LASER PROCESSING METHOD

BACKGROUND OF THE INVENTION

The present invention relates to a laser processing method for use in processing an object to be subjected to processes as drilling, cutting and welding. Specifically, the laser processing method is preferable for drilling the whole surface of a board.

FIG. 7 shows a conventional laser processing apparatus. A laser beam 32 emitted from a laser oscillator 31 is directed downward by a turning mirror 33, and then focused (converged) by a lens 34 to be applied to an object to be processed placed on an X-Y stage 35. Positional accuracy in applying the laser beam depends on X-Y stage positioning accuracy.

FIG. 8 shows another conventional laser processing apparatus. A laser beam 32 emitted from a laser oscillator 31 is reflected by a pair of turning mirrors 36, and thereafter focused and applied to an object to be processed 38 by a flat field lens (fθ lens) 37 to be used for laser processing. Further, the object to be processed is movable within a specified range by the operation of the X-Y stage 35. It is to be noted that the movement of the object to be processed by the operation of the X-Y stage is not such areas that areas in which focusing points of the laser beam are to be positioned by driving the pair of the turning mirrors, do not overlap with each other and do not producing any space between the areas.

In the first prior art apparatus, the optical axis of the laser beam is fixed, and therefore the positioning of the application point of the laser beam with respect to the object to be processed is effected by moving the X-Y stage, such that the positioning accuracy is relatively high. However, the speed of application of the laser beam to the object to be processed is governed by the speed at which the X-Y stage, can be moved and positioned. In general, the speed of moving and positioning the X-Y stage is about 5 to 10 points per second, and the speed is ¹/₁₀ or lower than the speed of positioning the laser beam by the turning mirror.

The second prior art apparatus has such a construction that chip resistor components mounted in a scattered manner on a board are measured in position one by one through image recognition, and the laser beam applying position is determined based on a result of measurement, by which the laser beam is used for trimming, locally marking the object to be processed, or for similar purposes. According to this construction, when the object to be processed is moved by the X-Y stage, the areas on which focusing points of the laser beam are to be positioned by driving the pair of turning mirrors will possibly overlap each other and/or a space is possibly be produced between the areas. Therefore, the position of a laser beam applying point in the processing area cannot be expressed by coordinate values within one coordinate system. Therefore, in order to apply the laser beam to the correct position, a reference position must be confirmed through image recognition or similar means every time the X-Y stage is moved. The above-mentioned practice results in an increased processing time and requires the provision of a recognition mark representing the reference position arranged at each portion, and the practice lacks generality in use.

SUMMARY OF THE INVENTION

Accordingly, the present invention has been made to solve the aforementioned issues, and it is an object of the present invention to provide a laser processing method capable of executing laser beam application to an object processing area correctly at high speed.

In accomplishing these and other aspects, according to a first aspect of the present invention, there is provided a laser processing method to be executed by a pair of turning mirrors of which axes of rotation are arranged in mutually twisted positions, a flat field lens for converging a laser beam reflected by the pair of turning mirrors on a specified plane, and an X-Y stage which carries and moves thereon an object to be processed to which the laser beam is applied, the surface of the object being divided into a plurality of identically shaped, contiguous, non-overlapping rectangular planer areas disposed as a matrix the method comprising:
a first step of executing application of the laser beam of which a laser applying position is determined by the pair of turning mirrors and the flat field lens to one of the rectangular planer areas of the object;
a second step of moving an X-axis stage or a Y-axis stage of the X-Y stage after the first step is completed;
a third step of executing application of the laser beam to one of the rectangular planar areas which is adjacent to the rectangular planar area to which the laser beam has most recently been applied; and
a fourth step of executing the second and third steps alternately to process the plurality of rectangular planar areas of the object.

According to a second aspect of the present invention, there is provided the laser processing method, wherein the first and third steps each comprises:

a step of grouping laser beam application points, which exist in the planar area to be subjected to the laser application and are expressed by coordinate values of an orthogonal coordinate system including all of the planar areas, into the rectangular planar areas arranged in the matrix form; and a step of transforming the coordinate values at each of the laser beam application points in each of the rectangular planar areas into coordinate values of an orthogonal coordinate system defined by a combination of the pair of turning mirrors and the flat field lens with a center of each of the rectangular planar areas made to serve as an origin, whereby the pair of turning mirrors are driven based on resulting transformed coordinate values to execute the laser beam application to an inside of each of the rectangular planar areas.

According to a third aspect of the present invention, there is provided the laser processing method wherein the first and third steps each comprises a step of correcting a geometric scanning distortion generated in applying the laser beam on the planar area through scanning, in the correcting step, numerical data representing the laser applying position to be inputted to a controller for driving the pair of turning mirrors for positioning the applying position is corrected based on a result of measuring a position of a trace of the laser beam application onto the plane by combination of the pair of turning mirrors and the flat field lens.

According to a fourth aspect of the present invention, there is provided the laser processing method wherein the first and third steps each comprises a step of correcting numerical data representing the laser applying position to be inputted to a controller for driving the pair of turning mirrors for positioning the applying position, when orthogonal axes of the orthogonal coordinate system defined by a combination of the pair of turning mirrors and the flat field lens are not coinciding with orthogonal axes of an orthogonal coordinate system of the X-Y stage, so as to make both the orthogonal axes coincide with each other by correcting an angular deviation in a rotational direction between the two orthogonal axes.

According to a fifth aspect of the present invention, there is provided the laser processing method wherein the first and second steps each comprises a step of measuring the angular deviation in the rotational direction between the orthogonal axes of the orthogonal coordinate system defined by the combination of the pair of turning mirrors and the flat field lens and the orthogonal coordinate system of the X-Y stage, in the measuring step, an angle formed between a straight line which connects a plurality of traces of the laser beam application when the laser beam is applied to the object by moving either one of the X stage and the Y stage with the pair of turning mirrors fixed in position and a straight line which connects a plurality of traces of the laser beam application when the laser beam is applied to the object by rotating either one of the turning mirrors, the one mirror for scanning the laser beam in a direction approximately perpendicular to the straight line which connects the above-mentioned traces of the laser beam application with the X-Y stage fixed, is determined according to a result of measuring positions of traces of the laser beam application, and a deviation of said angle from a right angle is determined as an angular deviation amount of said two orthogonal axes.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
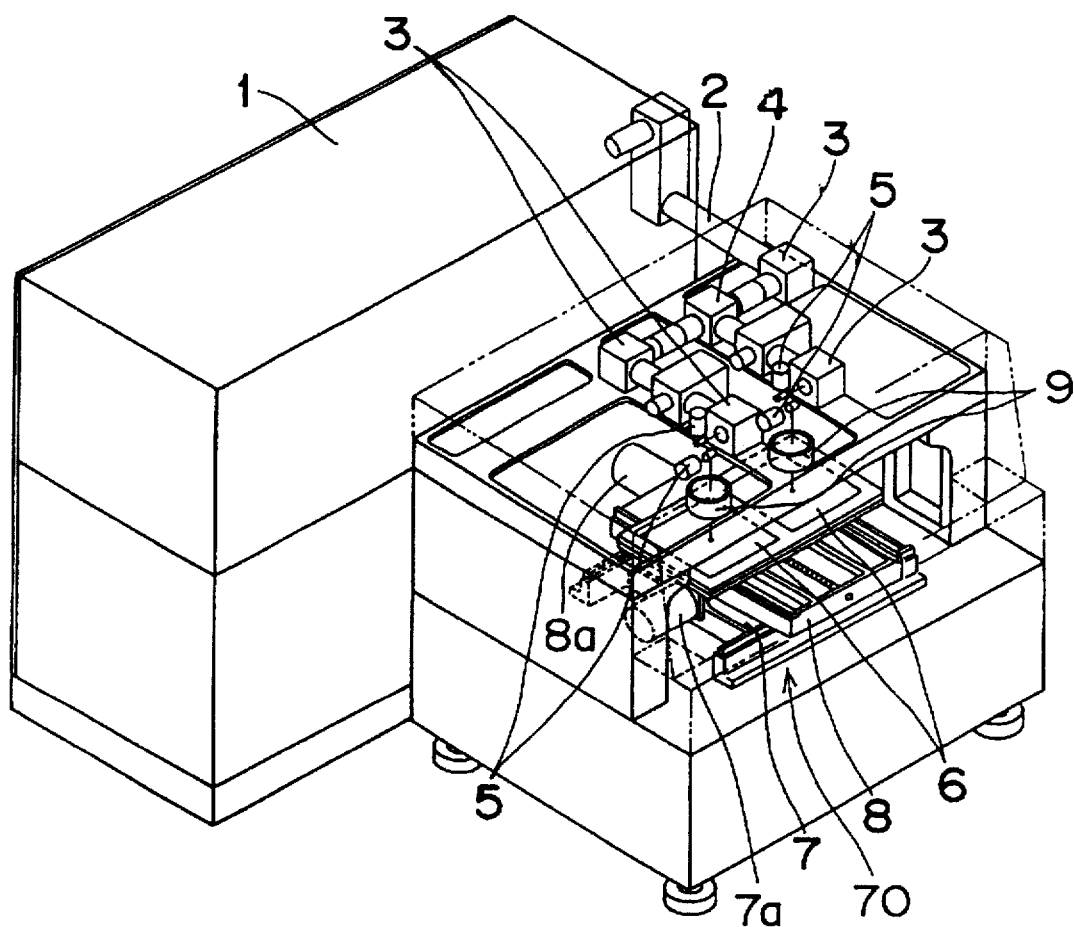
FIG. 1 is a view showing a laser drilling section of a laser processing apparatus according to an embodiment of the present invention.

Before the description of the present invention proceeds, it is to be noted that like parts are designated by like reference numerals throughout the accompanying drawings.

Figure 9:
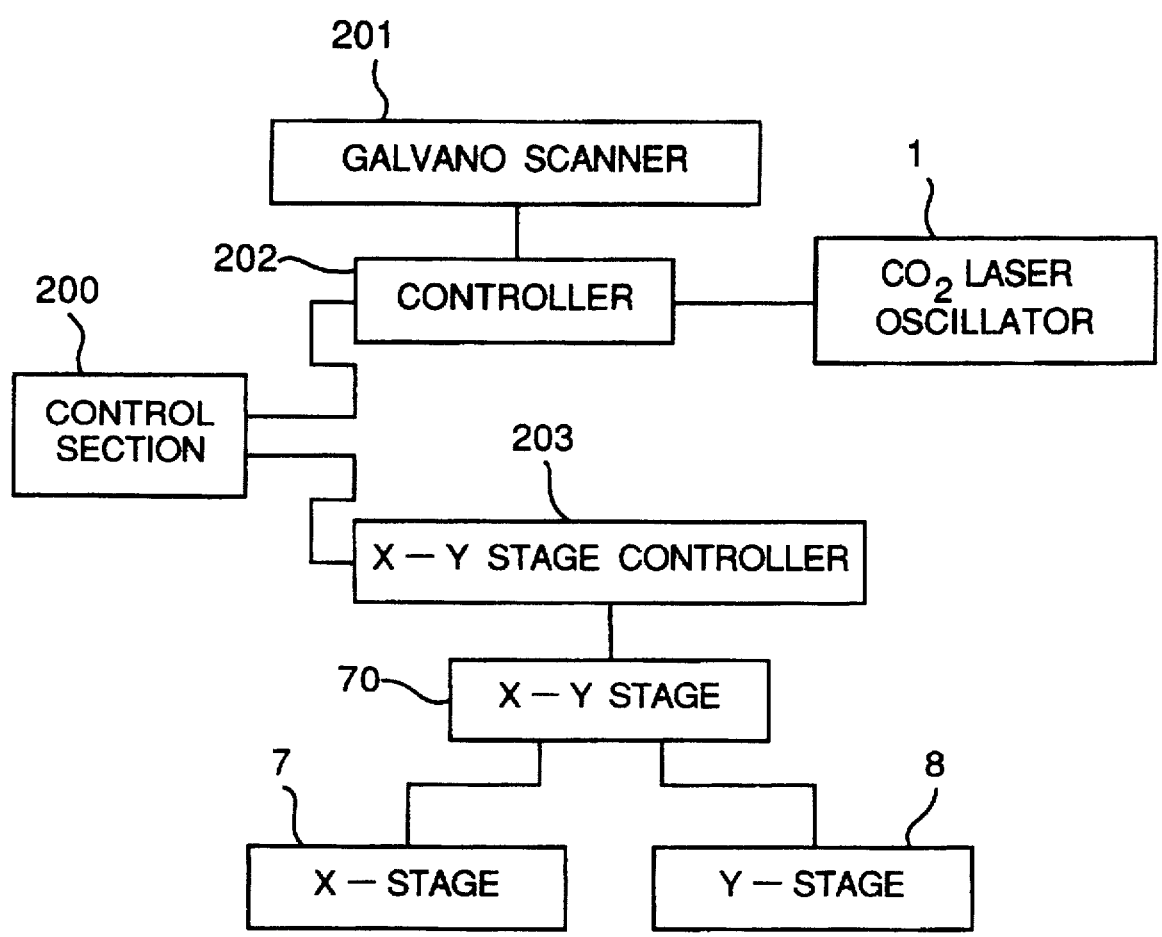
FIG. 9 is a block diagram of control sections of the apparatus of FIG. 1.

FIG. 1 shows a $CO_2$ laser drilling section for processing a board according to a laser processing apparatus of an embodiment of the present invention. In FIG. 1, there are included a $CO_2$ laser oscillator 1, a laser beam 2, a bending mirror 3 for reflecting the laser beam 2, a laser beam splitter 4 for splitting the laser beam 2 at an output ratio of 1:1, a pair of galvanometer mirrors 5 which are arranged in mutually twisted positions, a board 6 which is an object to be processed, an X-axis stage 7 of an X-Y stage 70 which is driven by a motor 7a, a Y-axis stage 8 of the X-Y stage 70 which is driven by a motor 8a, and an fθ lens 9 having a function for converging the laser beam 2 on a plane. As shown in FIG. 9, a controller 202 controls the operation of the oscillator 1 and the operation of a galvano scanner 201 for driving the pair of galvanometer mirrors 5. An X-Y stage controller 203 controls the operation of the X-Y stage 70 including the X-stage 7 and the Y-stage 8. A control section 200 controls the control operations of the controller 202 and the X-Y stage controller 203.

Figure 2:
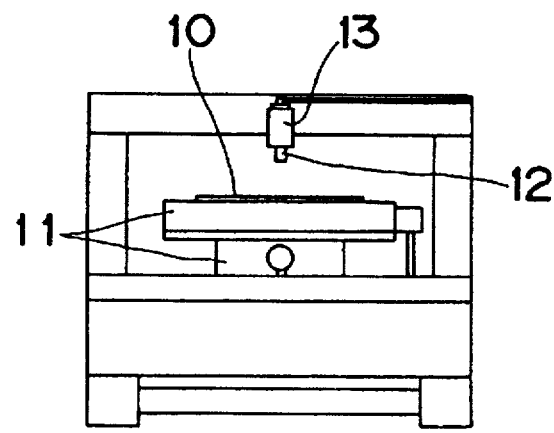
FIG. 2 is a structural view of a measuring section for measuring the position of a hole formed through a board in the above apparatus.

FIG. 2 shows a measuring section for measuring the position of a hole formed through the board by shape recognition. In FIG. 2, there are included a laser-processed board 10, an X-Y stage 11, an objective lens 12, and a CCD camera 13 for monitoring the hole enlarged by the objective lens 12.

The laser processing apparatus of the present embodiment is comprised of the laser drilling section and the measuring section. However, the sections can be integrated with each other.

Operation of the present laser processing apparatus will be described below.

Figure 3:
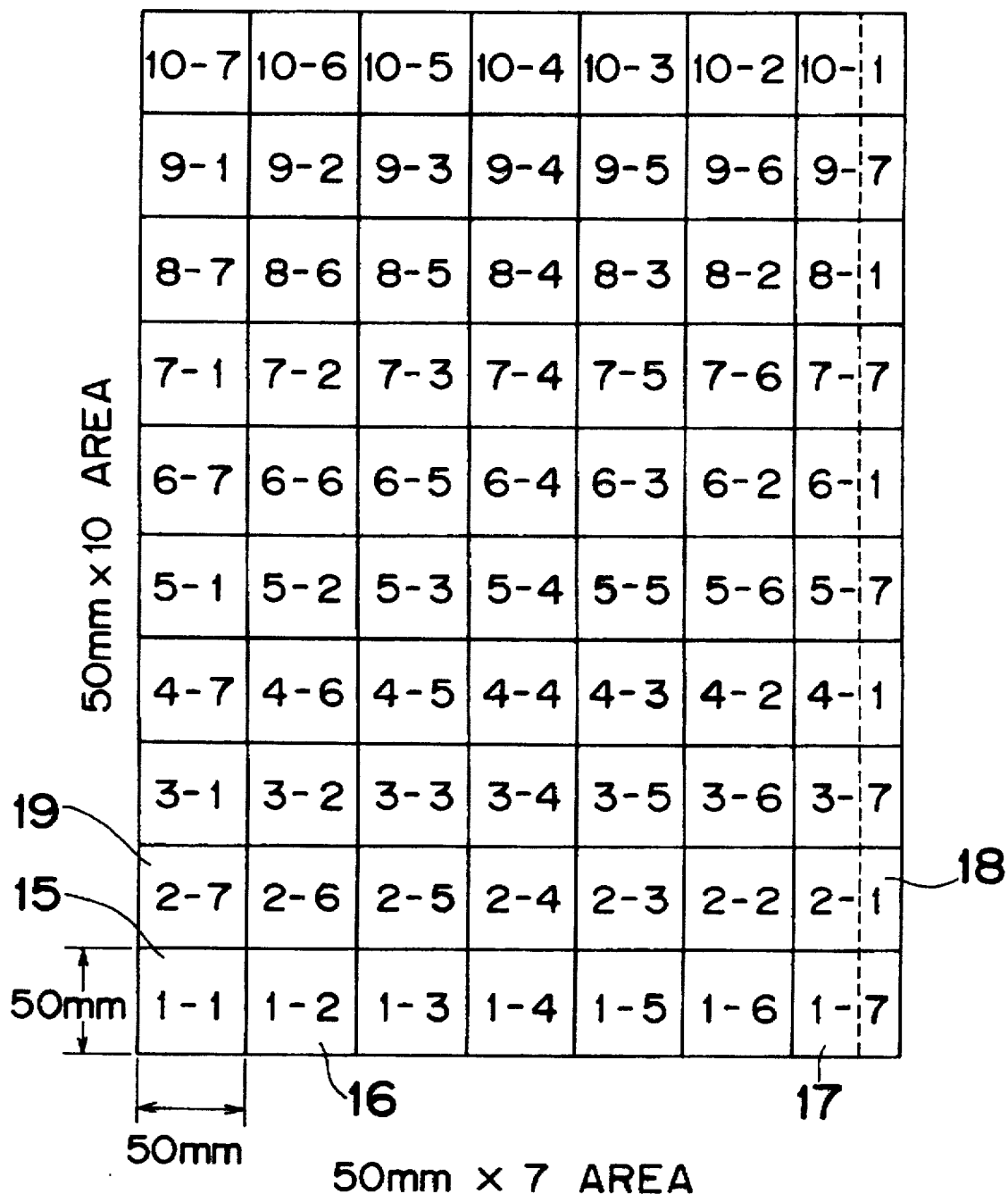
FIG. 3 is a schematic view showing a state in which the board is segmented into a plurality of rectangular areas arranged in a matrix form in the above embodiment.
Figure 10:
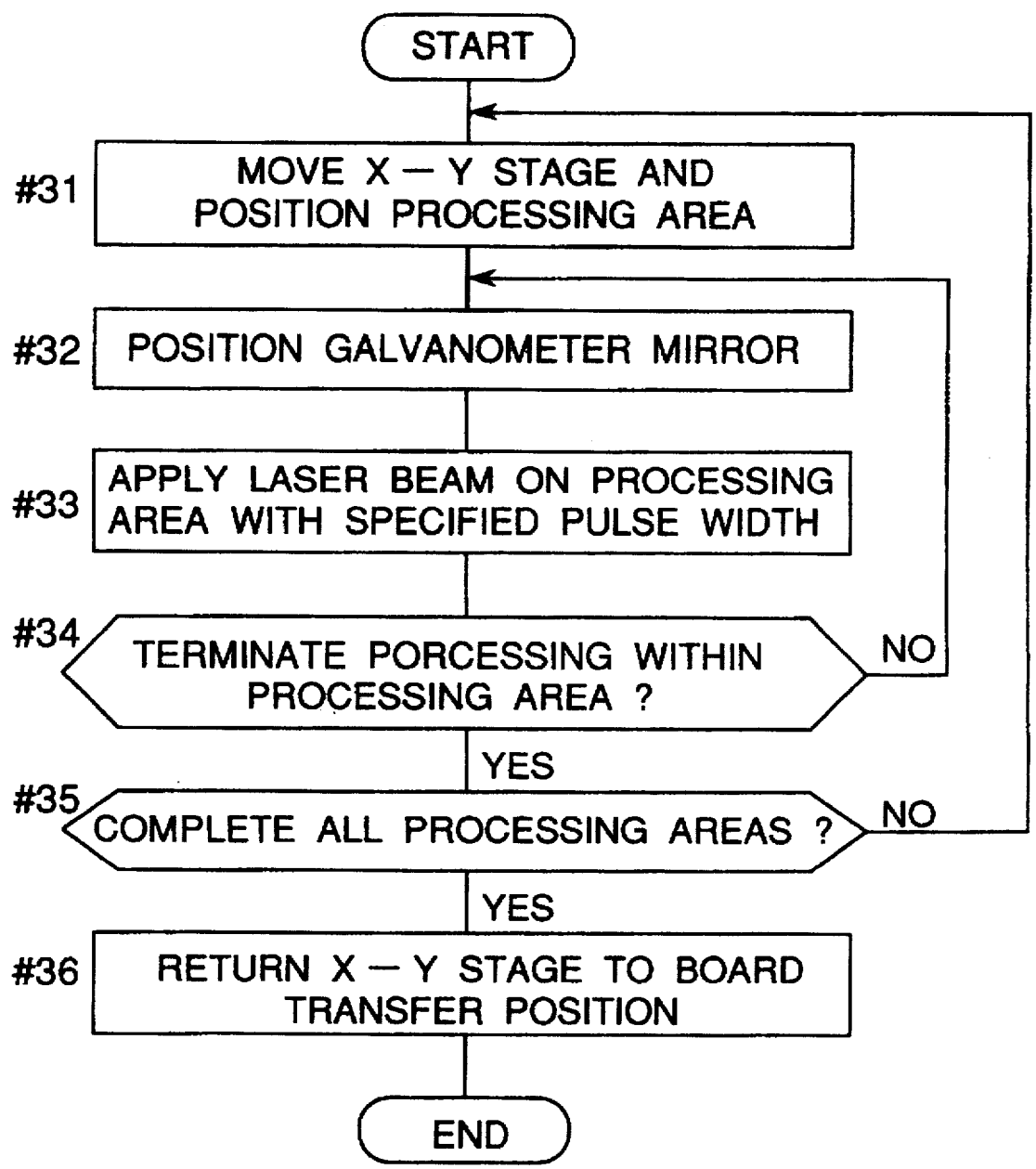
FIG. 10 is a flow chart showing a drilling operation of the apparatus of FIG. 1.

FIG. 3 is a schematic view of a state in which a board having dimensions of 500 mm×350 mm is segmented into rectangular areas of 50 mm×50 mm arranged in a matrix form. FIG. 10 is a flow chart showing a drilling operation of the apparatus of FIG. 1. With the movement of the X-Y stage 70 at step #31, a rectangular area 15 denoted by 1-1 is placed just below the fθ lens 9, and at step #32, turning and positioning the pair of galvanometer mirrors 5 are executed. In synchronization with the above operation, at step #33, the laser beam 2 with a specified pulse width is irradiated from the $CO_2$ laser oscillator 1. The laser beam 2 transmitted by the bending mirror 3 is reflected by the galvanometer mirrors 5, and then focused on the board 6 by the fθ lens 9 to drill holes specified positions within the area. At step #34, it is decided whether or not the processing within the processing area is terminated. That is, until the laser beam application to the area 1-1 is completed, the operation of positioning the galvanometer mirrors 5 at step #32 and the operation of applying the laser beam on the processing area 1-1 at step #33 are repeated. When the laser beam application to the area 1-1 is completed at step #34, it is decided whether or not the drilling operations of all processing areas are completed at step #35. If no at step #35, the step #31 through step #34 are repeated. That is, the X-axis stage 7 moves by 50 mm, and a rectangular area 16 denoted by 1-2 is placed just below the fθ lens 9, and then drilling is performed in specified laser beam applying positions in the same manner as in the area 15. When the drilling process for up to a rectangular area 17 denoted by 1-7 is completed in the same manner as above, the Y-axis stage 8 moves by 50 mm, and a rectangular area 18 denoted by 2-1 is placed just below the fθ lens 9, and then specified drilling is performed. Then, the drilling for the rectangular areas 2-2 through 2-6 and the movement of the X-axis stage 7 are alternately repeated. When the drilling for up to a rectangular area 19 denoted by 2-7 is completed, the Y-axis stage 8 moves again by 50 mm, and an area denoted by 3-1 is placed just below the fθ lens 9. Thus, the specified drilling is effected on all the rectangular areas 3-2 through 10-7, so that the drilling process for the board having dimensions of 500 mm×350 mm is completed. Thereafter, at step #36, the X-Y stage 70 is returned to its the board transfer position for carrying out the drilled board 6.

Figure 11:
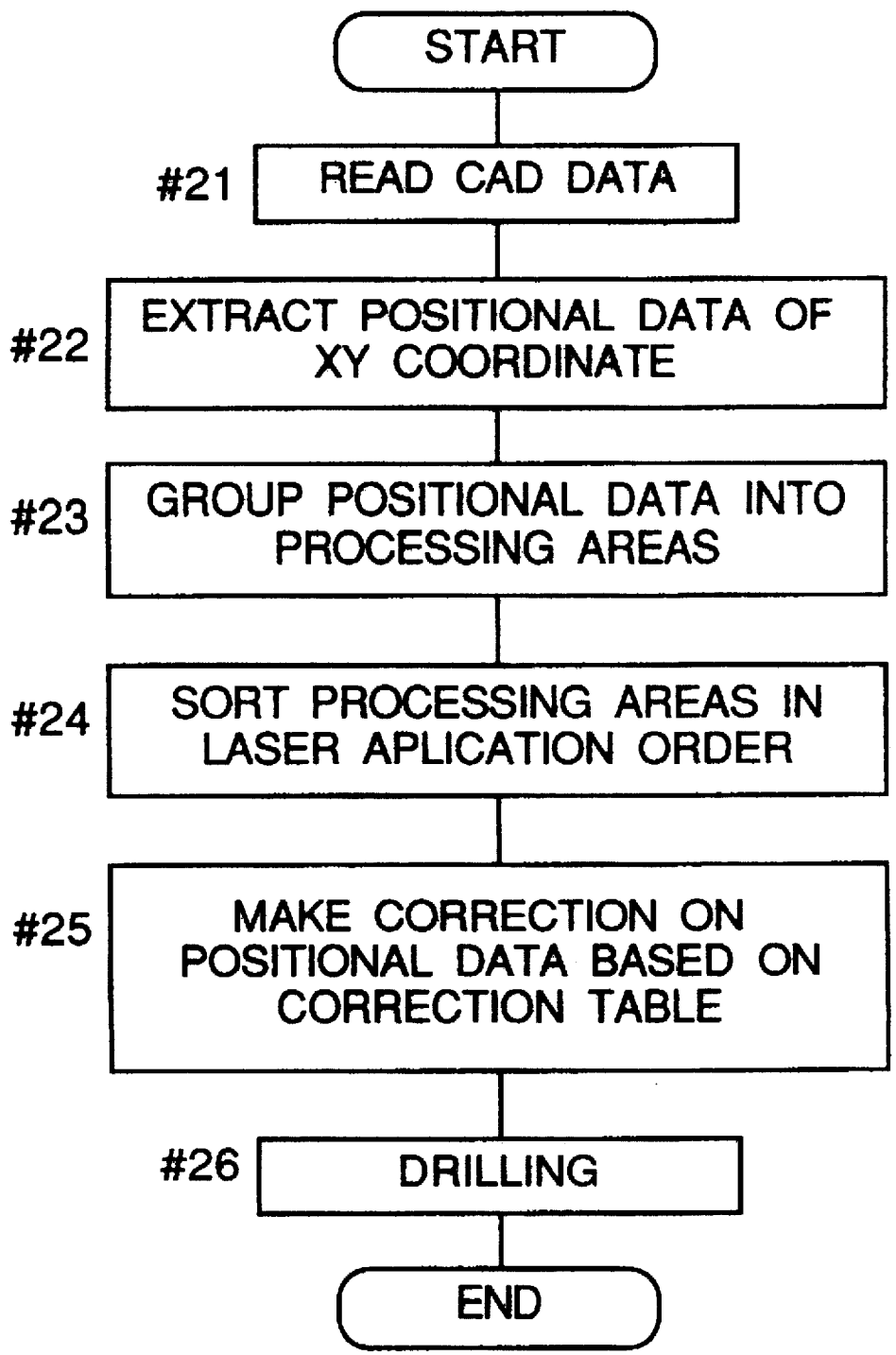
FIG. 11 is a flow chart showing a correction operation of positional data of the apparatus of FIG. 1.

FIG. 11 is a flow chart showing correction of positional data of the apparatus of FIG. 1. At step #21, necessary CAD data is firstly read from a database, e.g. stored in a floppy disk by operating a personal computer having the control section 200 and the controller 202 at step #21 and positional data of the XY coordinate system are extracted from the read CAD data at step #22. That is, the initial position to be subjected to the drilling process on the board 6 by laser beam application is set at an origin located at a lower left corner of the board 6, and then expressed by coordinate values of an orthogonal coordinate system (the XY coordinate system) having its X-axis along the lower side of the board 6. At step #23, these coordinate values are grouped in every area after the board 6 is segmented into the rectangular areas of 50 mm×50 mm arranged in a matrix form, and at step #24, the processing areas are sorted in the above-mentioned laser application order wherein the adjacent areas are continuously connected to each other. At step #25, with the center of each rectangular area of 50 mm×50 mm made to serve as an origin, the grouped coordinate values are transformed into coordinate values in an orthogonal coordinate system in which its two axes are defined by a trace of the focusing point of the laser beam 2 that moves on the board 6 through the origin when the pair of galvanometer mirrors 5 are turned one by one. The transformation is performed referring to a correction table described later. Based on the coordinate values, at step #26, positioning of the pair of galvanometer mirrors 5 is performed, so that the specified drilling is performed in each rectangular area as shown in FIG. 10.

Figure 4A:
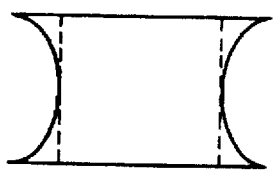
FIG. 4 is a view schematically showing a geometric distortion generated in a trace of positioning.
FIG. 4B is a view schematically showing a geometric distortion generated in a trace of positioning.
FIG. 4C is a view schematically showing a geometric distortion generated in a trace of positioning.
FIG. 4D is a view showing coordinate points in a specified area.
FIG. 4E is a view showing a result of drilling performed based on coordinate values of the coordinate points.
Figure 4B:
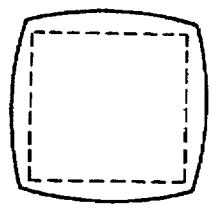
Figure 4C:
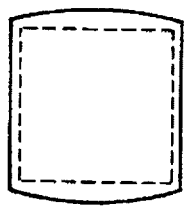
Figure 4D:
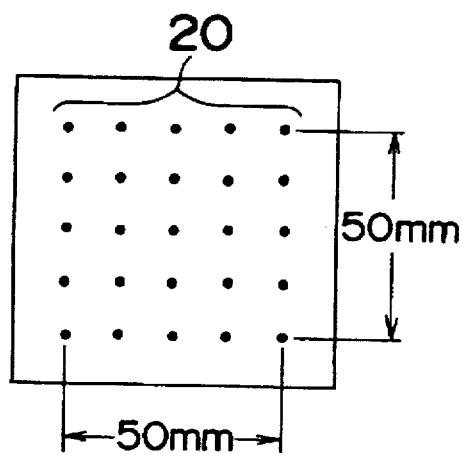
Figure 4E:
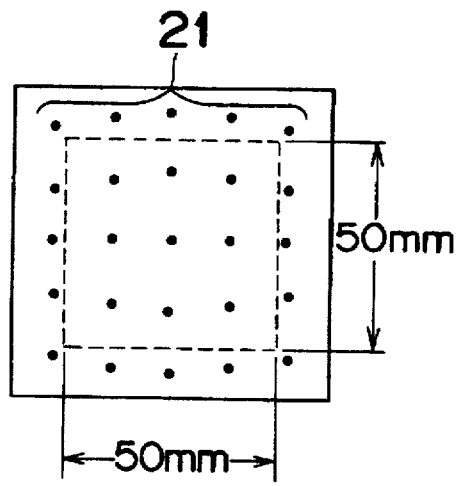

FIGS. 4A through 4C schematically show a geometric distortion generated in the trace of positioning when the laser beam 2 is positioned by means of a combination of the pair of galvanometer mirrors 5 and the fθ lens 9. There are two types of distortion including a pincushion distortion (FIG. 4A) caused by the geometric arrangement of the pair of galvanometer mirrors 5 and a distortion (FIG. 4B) caused by a linearity error in optically designing the fθ lens 9. When they are combined with each other, there is formed a geometric distortion (FIG. 4C) generated in the trace of positioning. In the present laser processing apparatus, a laser beam is applied onto a board to perform drilling based on coordinate values of coordinate points 20 arranged in a matrix form at regular intervals in a square area as shown in FIG. 4D. A result of the drilling is shown in FIG. 4E. By measuring the positions of holes 21 by means of the measuring section shown in FIG. 2 and comparing the measurement result with the coordinate values of the coordinate points, a difference between the distorted shape and the original square shape is obtained. Then, by correcting the coordinate values obtained through the transformation for performing specified drilling in the rectangular area of 50 mm×50 mm, there can be achieved laser beam application to the correct coordinate points which includes no distortion error. The present laser processing apparatus has a function for automatically processing the above-mentioned series of corrections by inputting the measurement result to the controller 202.

Figure 5A:
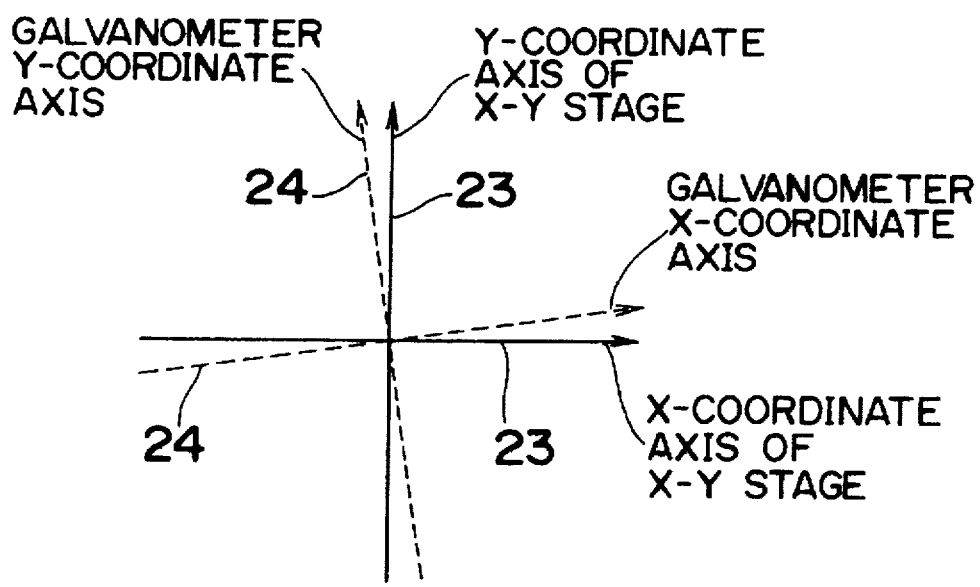
FIG. 5A is a diagram showing a rotational deviation of the coordinate system of a galvanometer from that of an X-Y stage.
Figure 5B:
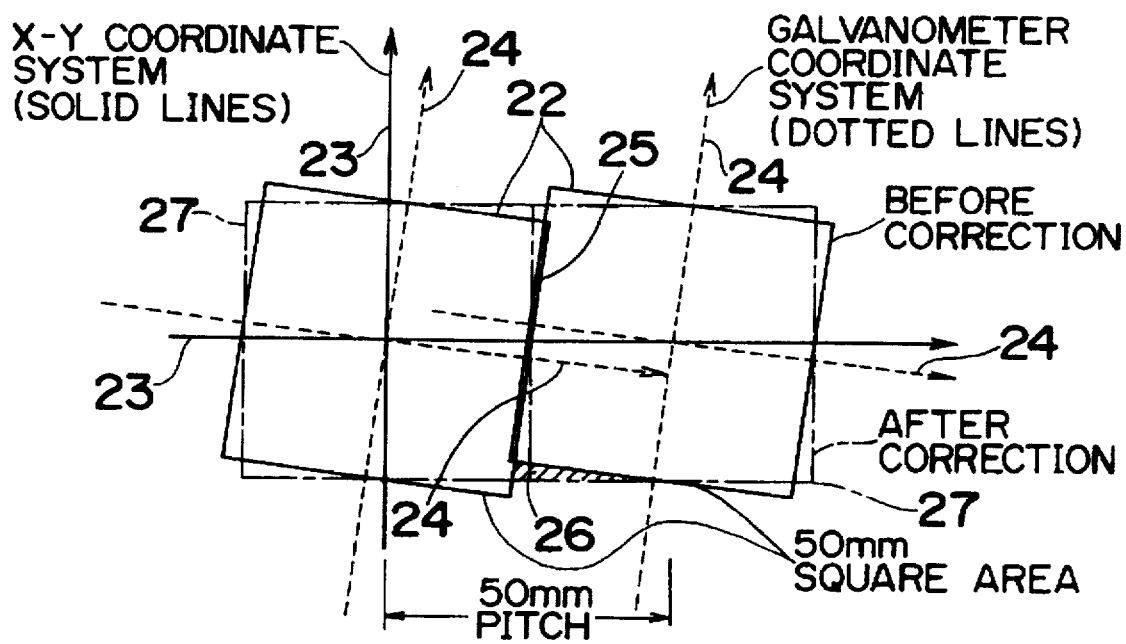
FIG. 5B is a diagram showing adjacent rectangular areas each having an area of 50 mm×50 mm.

In the present laser processing apparatus, in order to correctly apply the laser beam to the positions at which the drilling is to be performed on the board, adjacent rectangular areas each having dimensions of 50 mm ×50 mm are requested to be arranged so that they do not overlap each other and there is no gap. For example, the right side of the rectangular area of 50 mm×50 mm denoted by 1-1 and the left side of the area denoted by 1-2 shown in FIG. 3 must be arranged so that they are correctly aligned with each other. In order to correctly align the sides with each other, the orthogonal coordinate system of the X-Y stage 70 and the orthogonal coordinate system of the pair of galvanometer mirrors 5 are required to be aligned with each other in the rotational direction. FIGS. 5A and 5B show adjacent rectangular areas 22 of 50 mm×50 mm. When there is a deviation in the rotational direction between the orthogonal coordinate system 23 of the X-Y stage 70 and the orthogonal coordinate system 24 of the movement of the focusing point of the laser beam depending on the pair of galvanometer mirrors 5, the adjacent rectangular areas have an overlapped portion 25 (refer to the figure before correction shown by solid lines in FIG. 5B). Further, when the rectangular areas inclined with respect to the orthogonal coordinate system of the X-Y stage 70 are arranged in a matrix form, a space 26 is generated outside the rectangular areas on the board. When such an overlap or space exists, the operation for grouping the coordinate values of positions at which drilling is to be performed on the board into the rectangular areas of 50 mm×50 mm cannot be executed correctly, and consequently correct laser beam application to the positions at which the drilling is to be performed cannot be achieved. A factor for causing the deviation in the rotational direction is a slight deviation of relative positions of the X-Y stage 70 and the pair of galvanometer mirrors 5 from the positions thereof set originally in designing the processing apparatus. However, it is technically difficult to correctly modify the deviation by mechanically adjusting the positional relationship. The present processing apparatus has a function for correcting the deviation in the rotational direction by subjecting the coordinate values obtained through the transformation for the drilling in the rectangular area of 50 mm×50 mm to rotational coordinate transformation by an angle corresponding to the deviation. By virtue of this function, fine tuning of the rotational deviation can be achieved. The corrected rectangular areas 27 are shown by dashed lines in FIG. 5B.

Figure 6:
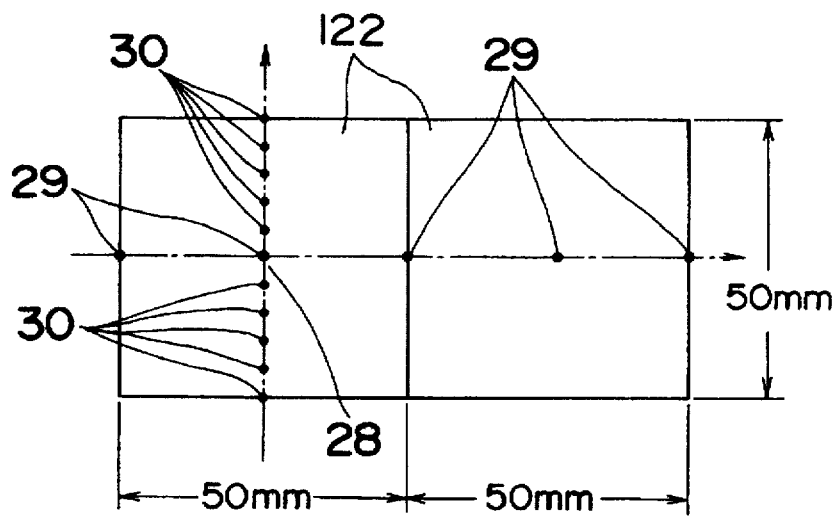
FIG. 6 is a view showing a state in which laser processing is executed for obtaining an angle of deviation in the rotational direction between orthogonal axes of the X-Y stage and orthogonal axes comprised of a pair of galvanometer mirrors.
Figure 7:
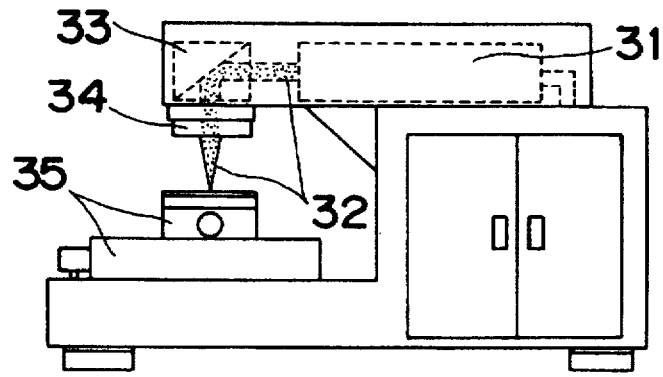
FIG. 7 is a view of a conventional laser processing apparatus.
Figure 8:
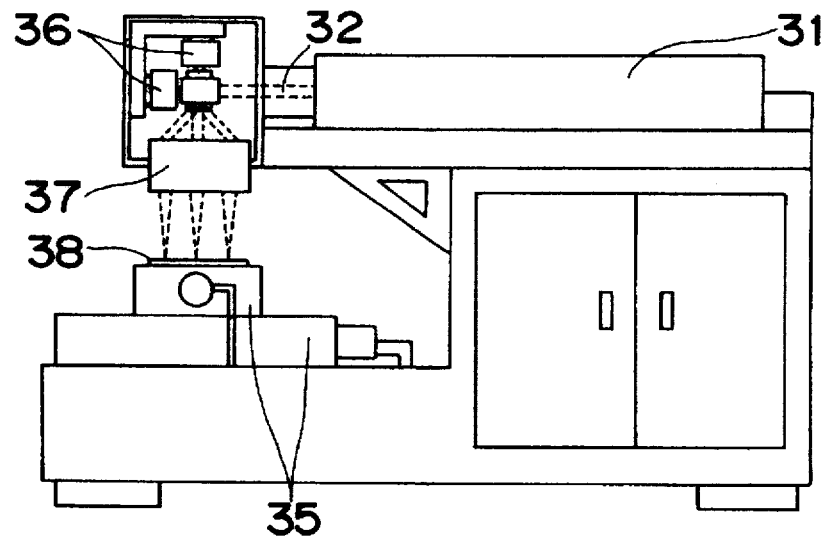
FIG. 8 is a view of another conventional laser processing apparatus.
Figure 12:
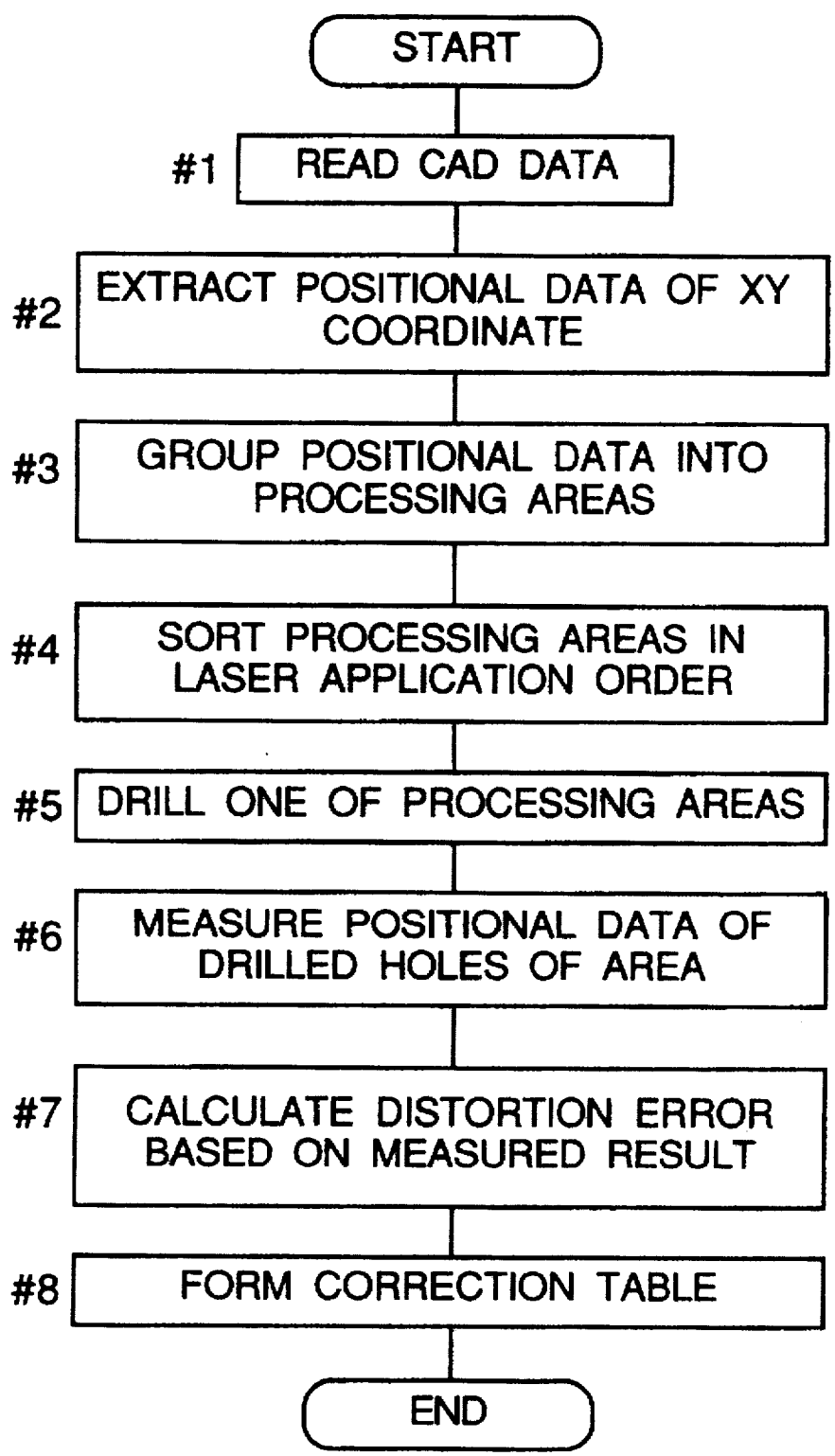
FIG. 12 is a flow chart showing an operation for forming a correction table of the apparatus of FIG. 1.

In order to correct the deviation in the rotational direction between the orthogonal axes of the X-Y stage 70 and the orthogonal axes comprised of the pair of galvanometer mirrors 5, it is indispensable to correctly measure the angle of rotational deviation. In the present processing apparatus, as shown in FIGS. 6 and 12, necessary CAD data is firstly read from the database at step #1 which is similar to the operation at step #21 and positional data of the XY coordinate system is extracted from the read CAD data at step #2. Then, at step #3, the positional data is grouped into seventy processing areas as shown in FIG. 6. At step #4, the processing areas are sorted in the laser application order wherein the adjacent areas are continuously connected to each other. At step #5, the drilling operation is carried out on one of the processing areas on a board which is a sample, and then at step #6, positional data of drilled holes of the area are measured with the measuring section. At step #7, distortion error is calculated based on the measured result to form the correction table at step #8. Specifically, there are measured positions of five holes 29 formed by applying the laser beam 2 onto the board 6 while moving the X-axis stage 7 with the pair of galvanometer mirrors 5 fixed in a position in which the laser beam is applied to an origin 28 of the coordinate system within the rectangular area 122 of 50 mm×50 mm by the aforementioned measuring section, and then an inclination of a straight line which passes through the five points 29 is obtained by polynomial approximation. Subsequently, by the aforementioned measuring section, there are measured positions of ten holes 30 formed by applying the laser beam 2 onto the board 6 while turning and positioning only one mirror of the pair of galvanometer mirrors 5 with the X-Y stage 70 fixed without any movement, the one mirror moving the laser beam 2 in a direction approximately perpendicular to the straight line that passes through the aforementioned five points 29, and then an inclination of a straight line passing through the ten points 30 is obtained by polynomial approximation. From the inclinations, an angle formed between the two straight lines is determined, and a deviation of the above-mentioned angle from the right angle is determined to be an amount of angular deviation between the aforementioned two orthogonal axes to form the correction table which is stored in the controller 202. Then, by using the correction table, the coordinate values obtained through the transformation for the drilling in the aforementioned rectangular area of 50 mm×50 mm are corrected by the rotational coordinate transformation. The above-mentioned correction is automatically performed by inputting the measurement results of the five points 29 and the ten points 30 to the controller 202 of the processing apparatus. Further, the number of holes to be measured is properly increased or decreased according to the required accuracy of statistic processing, and the number is not limited to five points nor ten points.

According to the embodiments, the specified laser beam application to the inside of the rectangular planar area by means of the pair of turning mirrors 5 and the flat field lens, i.e. fθ lens 9 for converging the laser beam 2 reflected on the pair of turning mirrors 5 on a specified plane and the movement of the X-axis stage 7 or the Y-axis stage 8 are alternately repeated to connect the rectangular planar areas in a matrix form. With the above-mentioned arrangement, a high-speed laser beam application to a broader laser beam application area can be achieved.

Furthermore, there is provided the function for grouping the position coordinate values of the laser beam application points expressed by an orthogonal coordinate system including the whole laser processing area into the aforementioned rectangular planer areas, and transforming the position coordinate values into coordinate values in the position coordinate system within the rectangular planar area. With the above-mentioned arrangement, processing based on data of the laser beam applying position designed by, for example, a CAD can be achieved, and this results in a generality in using the position data.

Furthermore, there is provided the function for measuring the position of the trace of the laser beam application onto a plane by the combination of the pair of turning mirrors 5 and the flat field lens 9, and correcting the numerical data representing the applying position to be inputted to the controller 202 for driving the pair of turning mirrors 5 for positioning the applying position based on the measurement result, as a means for correcting the geometric scanning distortion generated in scanning the laser beam 2 on the plane. With the above-mentioned arrangement, correct positioning of the laser beam applying position can be achieved.

Furthermore, there is provided the function for correcting the numerical data representing the applying position to be inputted to the controller 202 for driving the pair of turning mirrors 5 as a means for correcting the angular deviation in the rotational direction between the orthogonal axes of the orthogonal coordinate system comprised of the combination of the pair of turning mirrors 5 and the flat field lens 9 and the orthogonal axes of the orthogonal coordinate system of the X-Y stage 70 to make both the orthogonal axes coincide with each other. With the above-mentioned arrangement, the two orthogonal axes are made to correctly coincide with each other, so that the positional accuracy of the laser beam application can be improved.

Furthermore, there is provided the function for determining an angle formed between the straight line that connects the traces of laser beam application when the laser beam is applied to the object to be processed by moving either one of the X-axis stage 7 and the Y-axis stage 8 and the straight line that connects the traces of laser beam application when the laser beam is applied to the object to be processed by moving one of the pair of turning mirrors 5 based on the result of measuring the positions of the traces of laser beam application, and determining the deviation of the above-mentioned angle from the right angle as an amount of angular deviation between the aforementioned two orthogonal axes. With the above-mentioned arrangement, the angular deviation in the rotational direction between the orthogonal axes of the orthogonal coordinate system comprised of the combination of the pair of turning mirrors 5 and the flat field lens 9 and the orthogonal axes of the orthogonal coordinate system of the X-Y stage 70 is correctly obtained, so that the positional accuracy of the laser beam application can be further improved.

According to the laser processing apparatus of the present invention, the positioning of the laser beam can be achieved at high speed by the pair of turning mirrors and the flat field lens for converging on a specified plane the laser beam reflected on the pair of turning mirrors. Further, by alternately repeating the laser beam application to the specified rectangular planar area and the movement of the X-axis stage or the Y-axis stage so as to connect the specified rectangular planar areas in a matrix form, the laser beam application to a broader processing area within the movable range of the X-Y stage can be achieved.

Furthermore, there is provided the function for transforming the coordinate values in the laser beam applying positions expressed by one coordinate system including whole the processing area into coordinate values of the orthogonal coordinate system comprised of the pair of turning mirrors and the flat field lens with the center of each of the rectangular planar areas arranged in a matrix form made to serve as the origin, and executing laser beam application to the inside of each of the rectangular planar areas based on the transformed coordinate values. With the above-mentioned arrangement, the coordinate values in the laser beam applying position can be expressed by one coordinate system, and this arrangement provides overall improvement in executing the laser beam application in a variety of cases.

Furthermore, by correcting the numerical data representing the applying position to be inputted to the controller for driving the pair of turning mirrors based on the result of measuring the position of the trace of laser beam application, laser beam application to the correct position can be achieved.

Furthermore, there is provided the function for subjecting the numerical data representing the applying position to be inputted to the controller for driving the pair of turning mirrors to a rotational coordinate transformation process. With the above-mentioned arrangement, the angular deviation in the rotational direction between the orthogonal axes of the orthogonal coordinate system comprised of the combination of the pair of turning mirrors and the flat field lens and the orthogonal axes of the orthogonal coordinate system of the X-Y stage can be corrected, thereby allowing the laser beam application to the correct position to be achieved.

Furthermore, there is provided the function for measuring the positions of the traces of laser beam application to a plurality of portions effected by driving the turning mirrors and the positions of the traces of laser beam application to a plurality of portions effected by moving the X-Y stage to calculate an inclination of the straight line that connects the traces of laser beam application, and determining the angular deviation in the rotational direction between the orthogonal axes of the orthogonal coordinate system comprised of the combination of the pair of turning mirrors and the flat field lens and the orthogonal axes of the orthogonal coordinate system of the X-Y stage. With the above-mentioned arrangement, the deviation of the rotational angle can be correctly obtained.

Summarizing in brief the effects of the present embodiments, the high-speed laser processing which is enabled by the combination of the pair of turning mirrors and the flat field lens can be applied with high positional accuracy to a broader processing area.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A laser processing method to be executed by a pair of turning mirrors of which axes of rotation are arranged in mutually twisted positions, a flat field lens for converging a laser beam reflected on the pair of turning mirrors on a specified plane, and an X-Y stage which carries and moves thereon an object to be processed to which the laser beam is applied, the surface of the object being divided into a plurality of identically shaped contiguous non-overlapping rectangular planar areas disposed as a matrix, the method comprising:

a first step of executing application of the laser beam of which a laser applying position is determined by the pair of turning mirrors and the flat field lens to one of the rectangular planar areas of the object;

a second step of moving an X-axis stage or a Y-axis stage of the X-Y stage after the first step is completed;

a third step of executing application of the laser beam to one of the rectangular planar areas which is adjacent to the rectangular planar area to which the laser beam has most recently been applied; and a fourth step of executing the second and third steps alternatively to process the plurality of rectangular planar areas of the object; and wherein each of the first and third steps comprises:
  a step of grouping laser beam application points, which exist in the planar area to be subjected to the laser application and are expressed by coordinate values of an orthogonal coordinate system including all of the planar areas, into the rectangular planar areas arranged in the matrix form; and
  a step of transforming the coordinate values at each of the laser beam application points in each of the rectangular planar areas into coordinate values of an orthogonal coordinate system defined by a combination of the pair of turning mirrors and the flat field lens with a center of each of the rectangular planar areas made to serve as an origin,
  whereby the pair of turning mirrors are driven based on resulting transformed coordinate values to execute the laser beam application to an inside of each of the rectangular planar areas.

2. A laser processing method to be executed by a pair of turning mirrors of which axes of rotation are arranged in mutually twisted positions, a flat field lens for converging a laser beam reflected on the pair of turning mirrors on a specified plane, and an X-Y stage which carries and moves thereon an object to be processed to which the laser beam is applied, the surface of the object being divided into a plurality of identically shaped contiguous non-overlapping rectangular planar areas disposed as a matrix, the method comprising:

a first step of executing application of the laser beam of which a laser applying position is determined by the pair of turning mirrors and the flat field lens to one of the rectangular planar areas of the object;

a second step of moving an X-axis stage or a Y-axis stage of the X-Y stage after the first step is completed;

a third step of executing application of the laser beam to one of the rectangular planar areas which is adjacent to the rectangular planar area to which the laser beam has most recently been applied; and a fourth step of executing the second and third steps alternatively to process the plurality of rectangular planar areas of the object;

wherein each of the first and third steps comprises a step of correcting numerical data representing the laser applying position to be inputted to a controller for driving the pair of turning mirrors for positioning the applying position, when orthogonal axes of the orthogonal coordinate system defined by a combination of the pair of turning mirrors and the flat field lens are not coinciding with orthogonal axes of an orthogonal coordinate system of the X-Y stage, so as to make both the orthogonal axes coincide with each other by correcting an angular deviation in a rotational direction between the two orthogonal axes;

wherein each of the first and second steps comprises a step of measuring the angular deviation in the rotational direction between the orthogonal axes of the orthogonal coordinate system defined by the combination of the pair of turning mirrors and the flat field lens and the orthogonal coordinate system of the X-Y stage; and wherein, in the measuring step, an angle formed between a straight line which connects a plurality of traces of the laser beam application when the laser beam is applied to the object by moving either one of the X stage and the Y stage with the pair of turning mirrors fixed in position and a straight line which connects a plurality of traces of the laser beam application when the laser beam is applied to the object by rotating either one of the turning mirrors, the one mirror for scanning the laser beam in a direction approximately perpendicular to the straight line which connects the above-mentioned traces of the laser beam application with the X-Y stage fixed, is determined according to a result of measuring positions of traces of the laser beam application, and a deviation of said angle from a right angle is determined as an angular deviation amount of said two orthogonal axes.

* * * * *